United States Patent [19]

Jang

[11] Patent Number: 5,403,770

[45] Date of Patent: Apr. 4, 1995

[54] METHOD FOR FORMING A FIELD OXIDE FILM IN A SEMICONDUCTOR DEVICE

[75] Inventor: Se A. Jang, Bulaleub, Rep. of Korea

[73] Assignee: Hyundai Electronics Industries Co., Ltd., Rep. of Korea

[21] Appl. No.: 231,261

[22] Filed: Apr. 22, 1994

[30] Foreign Application Priority Data

Apr. 22, 1993 [KR] Rep. of Korea .................. 1993-6794

[51] Int. Cl.6 ............................................. H01L 21/76
[52] U.S. Cl. .......................................... 437/69; 437/72
[58] Field of Search ...................................... 437/69, 72; 148/DIG. 117, DIG. 85, DIG. 86

[56] References Cited

FOREIGN PATENT DOCUMENTS

| 63-136548 | 6/1988 | Japan . | |
|---|---|---|---|
| 15636 | 2/1989 | Japan | 437/69 |
| 1187950 | 7/1989 | Japan | 437/69 |
| 52-11233 | 8/1993 | Japan | 437/69 |

Primary Examiner—George Fourson
Attorney, Agent, or Firm—Merchant, Gould, Smith, Edell, Welter & Schmidt

[57] ABSTRACT

A method for forming a field oxide film in a semiconductor device, wherein the field oxide film is integral with a nitride film disposed on an active region, thereby preventing spacers formed from being easily spread on the upper surface of the nitride film disposed on the active region even though they are subjected to a force from the field oxide film in oxidation of a silicon substrate. This structure also inhibits lateral diffusion of oxygen and thereby reduces the length of bird's beak formed. The method also enables accurate formation of a required dimension of spacers so that the dimension of bird's beak formed can be minimized. Also the method of the present invention solves the problem of a nitride film loss upon forming the spacers and enables an accurate adjustment of a trench depth. Accordingly, it is possible to form a field oxide film exhibiting a good element isolation characteristic required in a highly integrated semiconductor device.

7 Claims, 8 Drawing Sheets

METHOD FOR FORMING A FIELD OXIDE FILM IN A SEMICONDUCTOR DEVICE

BACKGROUND OF THE INVENTION

1. Field of the Invention

The present invention relates to a method for forming a field oxide film adapted to electrically isolate elements formed on a wafer.

2. Description of the Prior Art

Generally, formation of such a field oxide film has progressed toward reduced occupied area for high integration and generation of reduced stress to a semiconductor substrate for minimized damage of the substrate, in order to ensure provision of active regions and improvement in isolation characteristic.

Figure 1A:
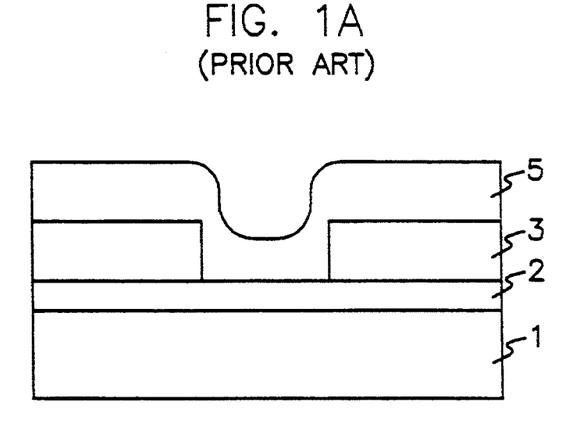
FIGS. 1A and 1B are sectional views respectively illustrating a conventional method for forming a field oxide film in a semiconductor device.
Figure 1B:
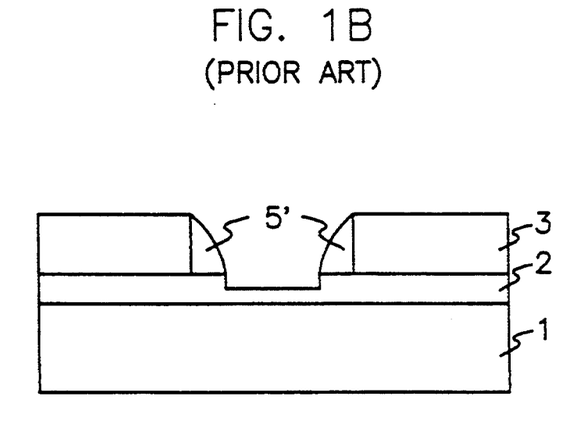

Referring to FIGS. 1A and 1B, there is illustrated a conventional field oxide formation method, wherein bar type spacers are formed.

Over a silicon substrate 1, first, a pad oxide film 2 and a first nitride film 3 are sequentially deposited in accordance with the illustrated method, as shown in FIG. 1A. The first nitride film 3 is then patterned to a predetermined size. Over the entire exposed surface of the resulting structure, a second nitride film 5 is formed using a chemical vapor deposition (CVD) process.

The second nitride film 5 is then subjected to an etching so as to form nitride film spacers 5', as shown in FIG. 1B. Upon the formation of the nitride film spacers 5', the pad oxide film 2 is partially etched. Thereafter, the resulting structure is subjected to formation of a field oxide film.

However, the first nitride film 3 may be reduced in thickness after the formation of the spacers 5' achieved by etching the second nitride film 5. As a result, an interface is present between the first nitride film 3 and each spacer 5'. Due to such an interface, the spacer 5' may be easily spread on the upper surface of the first nitride film 3, so that its downward pressing force is reduced. Consequently, the spacer 5' can not function effectively to prevent oxygen from being laterally diffused and thereby to inhibit a bird's beak. Since the width of the spacer 5' is also reduced, its use purpose can not be accomplished in the formation of the field oxide film.

Figure 2A:
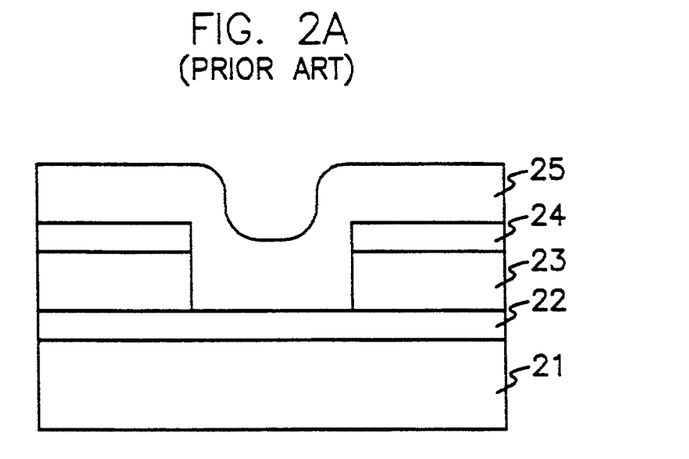
FIGS. 2A and 2B are sectional views respectively illustrating another conventional field oxide film formation method.
Figure 2B:
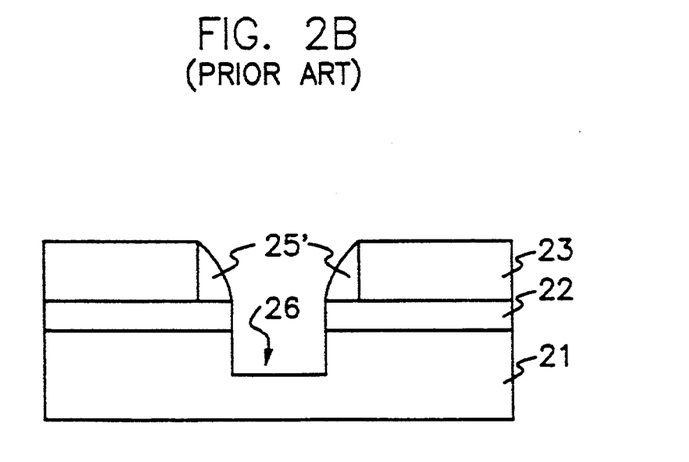

In FIGS. 2A and 2B, another conventional field oxide film formation method is illustrated, in which an element isolation is obtained by a trench formed in a semiconductor substrate.

Over a semiconductor substrate 21, first, a pad oxide film 22, a first nitride film 23 and an oxide film 24 are sequentially formed, as shown in FIG. 2A. The oxide film 24 is formed using the CVD process. The oxide film 24 and the first nitride film 23 are sequentially etched to have a predetermined size. A second nitride film 25 is then formed over the entire exposed surface of the resulting structure.

Thereafter, the second nitride film 25 is etched to form nitride film spacers 25'. Using the nitride film spacers 25' as a mask, the pad oxide film 22 and the silicon substrate 21 are sequentially etched so as to form a trench 26 having a depth of d. After the formation of the trench 26, a field oxide film for element isolation is finally formed.

In accordance with this method, however, the first nitride film may be etched during the etching of the silicon substrate. This is because the nitride films and the pad oxide film have similar etch selectivities, respectively. It is also difficult to obtain an accurate depth of the trench because a time etching process should be used to adjust the trench depth.

SUMMARY OF THE INVENTION

Therefore, an object of the invention is to eliminate the above-mentioned problems encountered in the prior art and to provide a method for forming a field oxide film in a semiconductor device, capable of avoiding variation in required thicknesses of deposited films due to etching in formation of the field oxide film and adjusting the depth of a trench formed in a semiconductor substrate.

In accordance with one aspect, the present invention provides a method for forming a field oxide film in a semiconductor device, comprising the steps of: forming a pad oxide film, a first nitride film and an etch barrier film, in this order, over a semiconductor substrate; forming a second nitride film over the etch barrier film to a thickness identical to that of the first nitride film; defining a field region on the resulting structure, sequentially etching the second nitride film and the etch barrier film to a predetermined dimension based on the definition of the field region, and forming a deposition film for spacers over the entire exposed surface of the resulting structure; etching the deposition film by use of a process for forming spacers and simultaneously etching the second nitride film and the first nitride film such that the pad oxide film is partially etched, thereby forming nitride film spacers; and forming a field oxide film in the field region by use of a thermal oxidation process and removing the remaining first nitride film and pad oxide film.

In accordance with another aspect, the present invention provides a method for forming a field oxide film in a semiconductor device, comprising the steps of: forming a pad oxide film, a polysilicon film, a first nitride film and an etch barrier film, in this order, over a semiconductor substrate; depositing a second nitride film over the etch barrier film to a thickness identical to that of the first nitride film; defining a field region on the resulting structure, sequentially etching the second nitride film and the etch barrier film to a predetermined dimension based on the definition of the field region, and forming a deposition film for spacers over the entire exposed surface of the resulting structure; etching the deposition film by use of a process for forming spacers and simultaneously etching the second nitride film and the first nitride film such that the polysilicon film is partially etched, thereby forming nitride film spacers; and forming a field oxide film in the field region by use of a thermal oxidation process and removing the remaining first nitride film, the polysilicon film and pad oxide film.

In accordance with another aspect, the present invention provides a method for forming a field oxide film in a semiconductor device, comprising the steps of: sequentially forming a pad oxide film and a first nitride film over a semiconductor substrate; forming a polysilicon film over the first nitride film to a thickness corresponding to a depth of a trench to be subsequently formed in the semiconductor substrate; forming a second nitride film over the polysilicon film to a thickness identical to that of the first nitride film; defining a field region on the resulting structure, sequentially etching the second nitride film and the polysilicon film to a predetermined dimension based on the definition of the field region, and forming a deposition film for spacers over the entire exposed surface of the resulting structure; etching the resulting structure downwards from the upper surface thereof until the pad oxide film is completely removed while the remaining polysilicon film is still maintained; forming a trench in the semiconductor substrate until the remaining polysilicon film is completely removed; and forming a field oxide film in the field region by use of a thermal oxidation process and removing the remaining first nitride film and pad oxide film.

BRIEF DESCRIPTION OF THE DRAWINGS

These and other objects, features and advantages of the invention will become more apparent upon a reading of the following detailed specification and drawings, in which.

DETAILED DESCRIPTION OF THE PREFERRED EMBODIMENTS

FIGS. 3A to 3E are sectional views respectively illustrating a method for forming a field oxide film in a semiconductor device in accordance with a first embodiment of the present invention.

Figure 3A:
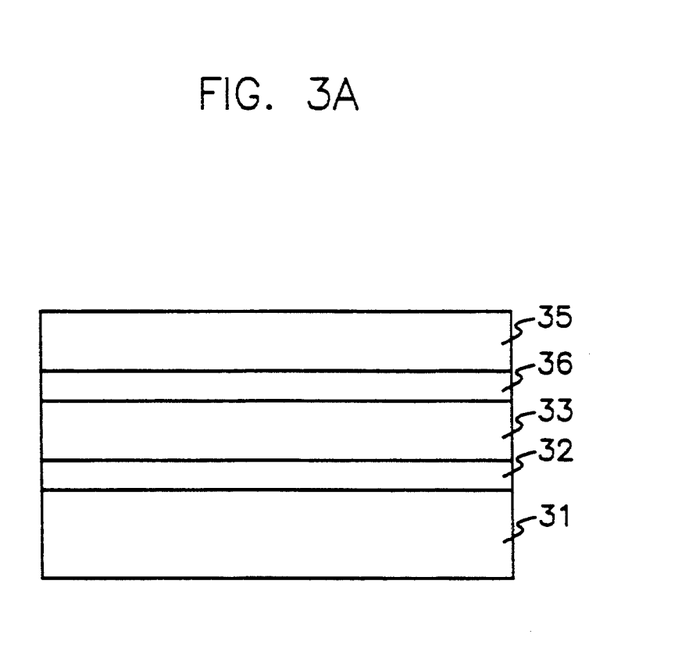
FIGS. 3A to 3E are sectional views respectively illustrating a method for forming a field oxide film in a semiconductor device in accordance with a first embodiment of the present invention.

In accordance with this embodiment, first, over a silicon substrate 31, a pad oxide film 32 of 50 to 300Å, a first nitride film 33 of 1,000 to 2,000Å, an etch barrier film 36 of 200 to 500Å and a second nitride film 35 of 1,000 to 2,000Å are formed in this order, as shown in FIG. 3A. The nitride films 33 and 35 have the same thickness. The etch barrier film 36 is comprised of a polysilicon film or a CVD oxide film.

Figure 3B:
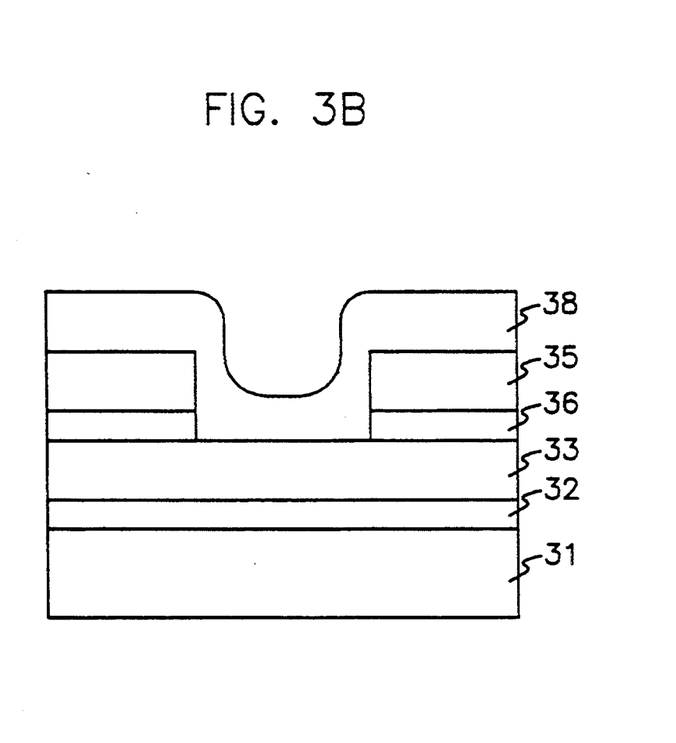

Thereafter, a field region is defined on the resulting structure. Then the second nitride film 35 and the etch barrier film 36 are sequentially etched to a predetermined size based on the field region definition, as shown in FIG. 3B. Over the entire exposed surface of the resulting structure, a deposition film 38 for spacers is formed. The deposition film 38 is comprised of a nitride film or a CVD oxide film and has a thickness of 300 to 1,000Å.

Figure 3C:
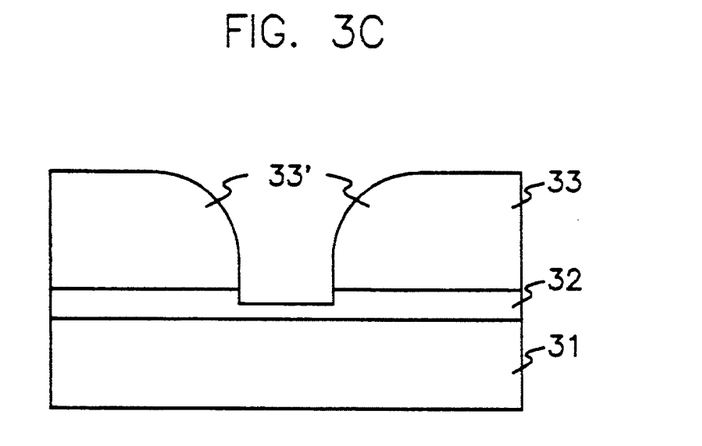

Subsequently, the deposition film 38 is etched using an etch process for forming spacers. At this time, the nitride films 35 and 33 are also etched until the pad oxide film 32 is partially removed, as shown in FIG. 3C. By the etching, nitride film spacers 33' are formed. Since the nitride films 33 and 35 have the same thickness, a reduction in thickness of the nitride film 33 on an active region is prevented by using the etch barrier film 36 as an etch stop in the etching step for forming the spacers 33'. The spacers 33' are comprised of the first nitride film 33.

Figure 3D:
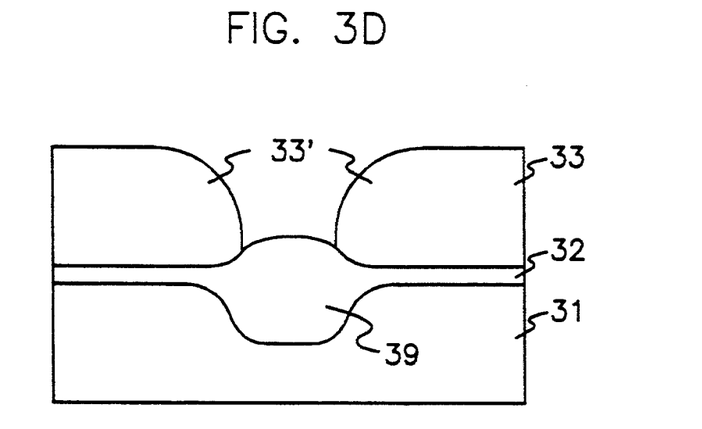

A field oxide film 39 is then formed using a thermal oxidation process, as shown in FIG. 3D.

Figure 3E:
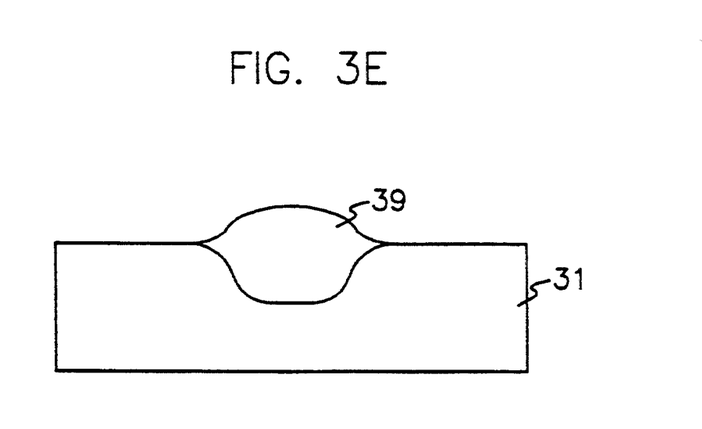

Finally, the remaining nitride film 33 and pad oxide film 32 are removed, as shown in FIG. 3E.

FIGS. 4A to 4E are sectional views respectively illustrating a method for forming a field oxide film in a semiconductor device in accordance with a second embodiment of the present invention.

Figure 4A:
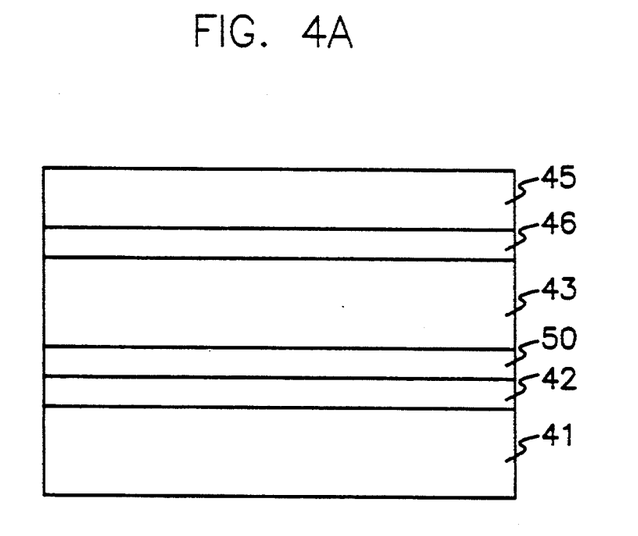
FIGS. 4A to 4E are sectional views respectively illustrating a field oxide film formation method in accordance with a second embodiment of the present invention.

In accordance with this embodiment, first, over a silicon substrate 41, a pad oxide film 42 of 50 to 300Å, a polysilicon film 50 of 200 to 1,000Å, a first nitride film 43 of 1,000 to 2,000Å, an etch barrier film 46 of 1,000 to 2,000Å and a second nitride film 45 of 1,000 to 2,000Å are formed in this order, as shown in FIG. 4A.

Figure 4B:
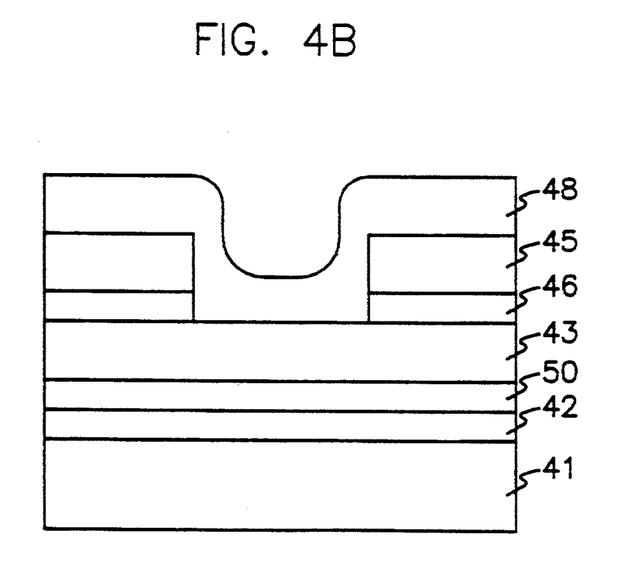

Thereafter, a field region is defined on the resulting structure. Then the second nitride film 45 and the etch barrier film 46 are sequentially etched to a predetermined size based on the field region definition, as shown in FIG. 4B. Over the entire exposed surface of the resulting structure, a deposition film 48 for spacers is formed. The deposition film 48 is comprised of a nitride film or a CVD oxide film and has a thickness of 300 to 1,000Å.

Figure 4C:
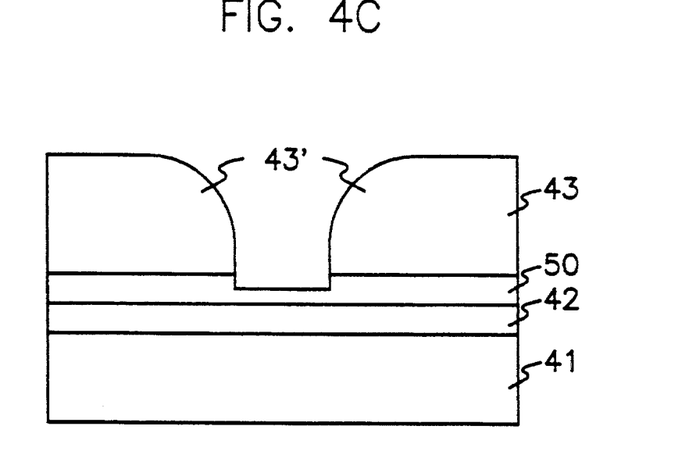

Subsequently, the deposition film 48 is etched using an etch process for forming spacers. At this time, the nitride films 45 and 43 are also etched until the polysilicon film 50 is partially etched, as shown in FIG. 4C. By the etching, nitride film spacers 43' are formed. Since the nitride films 43 and 45 have the same thickness, a reduction in thickness of the nitride film 43 on an active region is prevented by using the etch barrier film 46 as an etch stop in the etching step for forming the spacers 43'.

Figure 4D:
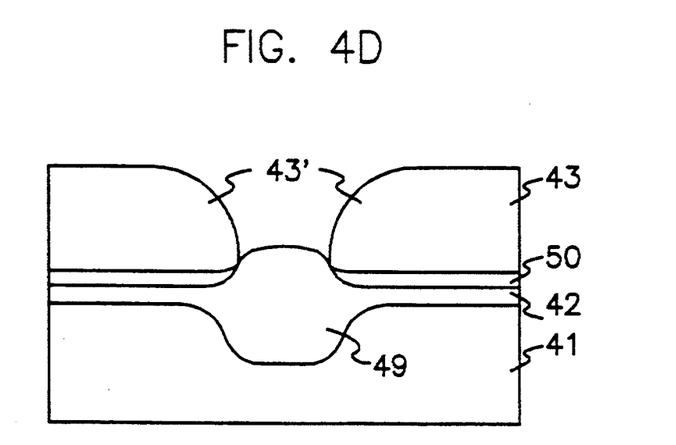
Figure 4E:
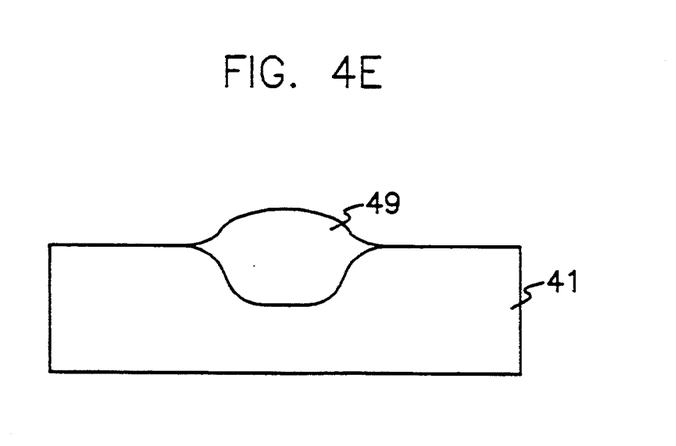

A field oxide film 49 is then formed using the thermal oxidation process, as shown in FIG. 4D. Finally, the remaining nitride film 43, polysilicon film 50 and pad oxide film 42 are removed, as shown in FIG. 4E.

FIGS. 5A to 5E are sectional views respectively illustrating a method for forming a field oxide film in a semiconductor device in accordance with a third embodiment of the present invention.

Figure 5A:
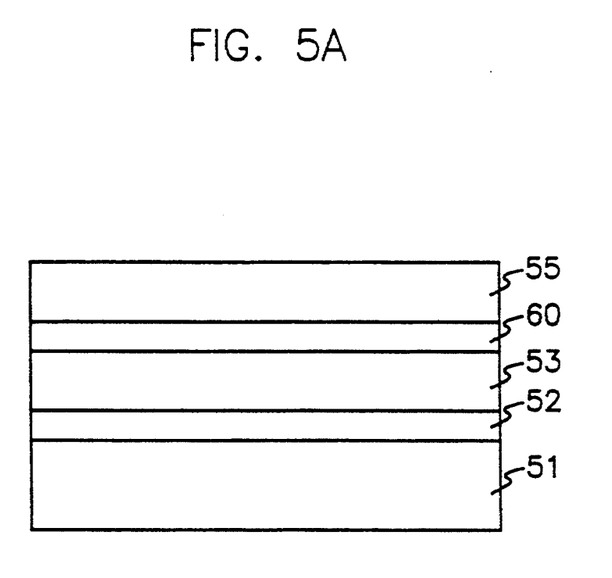
FIGS. 5A to 5E are sectional views respectively illustrating a field oxide film formation method in accordance with a third embodiment of the present invention.

In accordance with this embodiment, first, over a silicon substrate 51, a pad oxide film 52 of 50 to 300Å, a first nitride film 53 of 1,000 to 2,000Å, a polysilicon film 60 of 500 to 1,500Å and a second nitride film 55 of 1,000 to 2,000Å are formed in this order, as shown in FIG. 5A. The nitride films 53 and 55 have the same thickness.

Figure 5B:
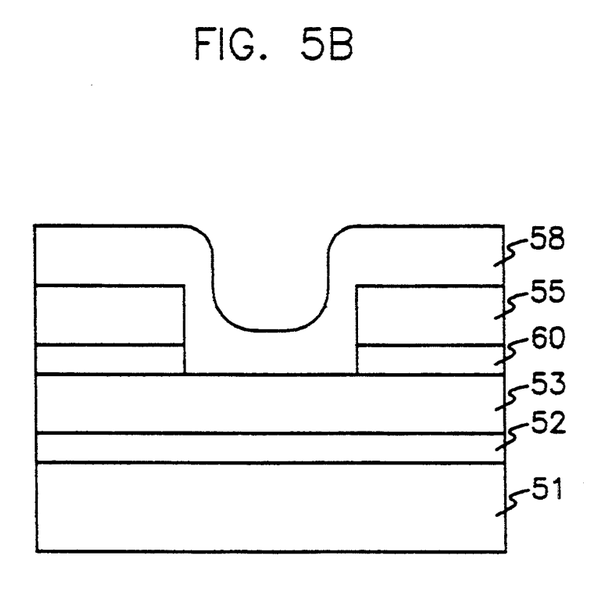

Thereafter, a field region is defined on the resulting structure. Then the second nitride film 55 and the polysilicon film 60 are sequentially etched to a predetermined size based on the field region definition, as shown in FIG. 5B. Over the entire exposed surface of the resulting structure, a deposition film 58 for spacers comprised of a nitride film or a CVD oxide film is formed to a thickness of 300 to 1,000Å.

Figure 5C:
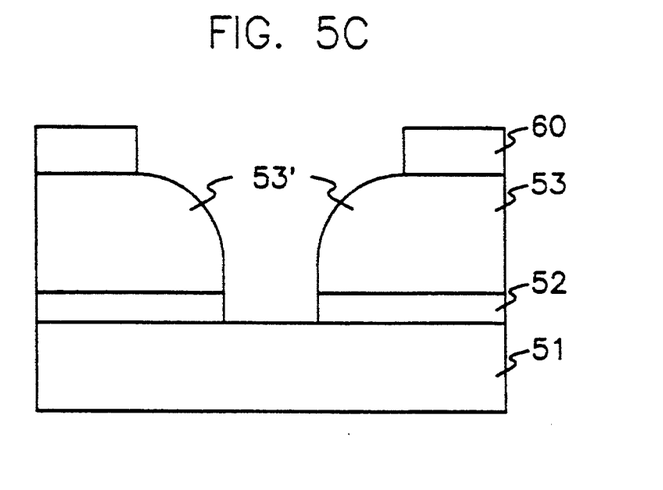

Subsequently, the deposition film 58 is etched using an etch process for forming spacers. At this time, the nitride films 55 and 53 and the pad oxide film 52 are also etched, as shown in FIG. 5C. After the etching, the polysilicon film 60 remains without being etched.

Figure 5D:
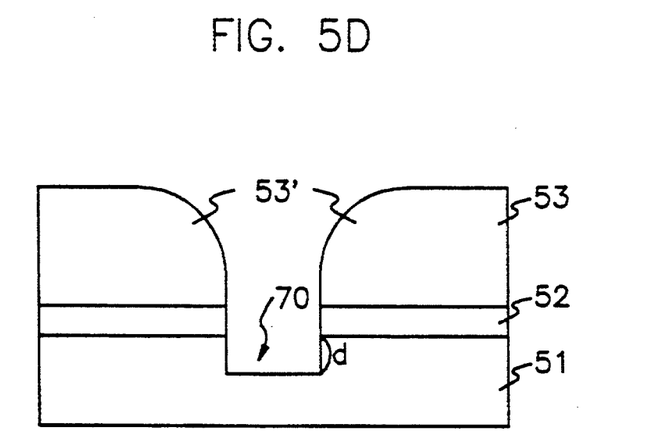

The resulting structure is then subjected to an etching for forming a trench until the polysilicon film 60 is completely removed, as shown in FIG. 5D. After the etching, the silicon substrate 51 has a trench 70 having a thickness of 500 to 1,500Å identical to the thickness d of the polysilicon film 60.

Figure 5E:
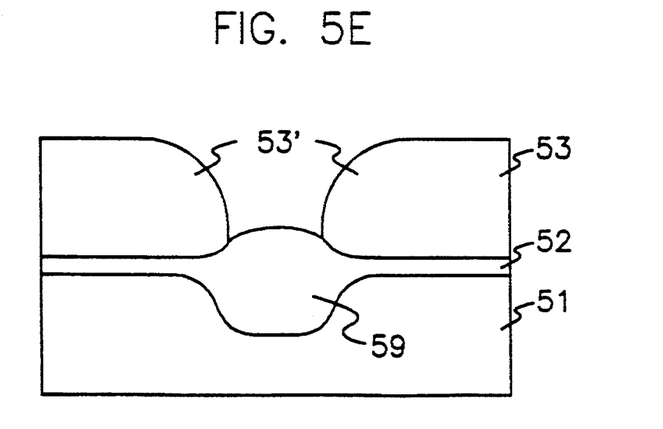

A field oxide film 59 is then formed using the thermal oxidation process, as shown in FIG. 5E. Finally, the remaining first nitride film 53 and pad oxide film 52 are removed.

In accordance with the above-mentioned embodiments, the field oxide film is integral with the nitride film disposed on the active region. With such a structure, the spacers are prevented from being easily spread on the upper surface of the nitride film disposed on the active region even though they are subjected to a force from the field oxide film in oxidation of the silicon substrate. Accordingly, it is possible to inhibit lateral diffusion of oxygen and thereby reduce the length of bird's beak formed, as compared to the conventional methods.

As apparent from the above description, the present invention provides a method for forming a field oxide film in a semiconductor device, capable of accurately forming a required dimension of spacers and thereby minimizing the dimension of bird's beak formed. Also the method of the present invention solves the problem of a nitride film loss upon forming the spacers and enables an accurate adjustment of a trench depth. Accordingly, it is possible to form a field oxide film exhibiting a good element isolation characteristic required in a highly integrated semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a field oxide film in a semiconductor device, comprising the steps of:
    forming a pad oxide film, a first nitride film and an etch barrier film, in this order, over a semiconductor substrate;
    forming a second nitride film over the etch barrier film to a thickness identical to that of the first nitride film;
    marking a field region, then sequentially etching the second nitride film and the etch barrier film to a dimension resulting from the marking of the field region, and forming a deposition film for spacers thereover;
    etching the deposition film by use of a process for forming spacers and simultaneously etching the second nitride film and the first nitride film such that the pad oxide film is partially etched, thereby forming nitride film spacers; and
    forming a field oxide film in the field region by use of a thermal oxidation process and removing the remaining first nitride film and pad oxide film.

2. A method in accordance with claim 1, wherein the pad oxide film, the first nitride film, and the etch barrier film have thicknesses of 50 to 300Å, 1,000 to 2,000Å, and 200 to 500Å, respectively.

3. A method in accordance with claim 1, wherein the etch barrier film is comprised of a polysilicon film or a chemical vapor deposition oxide film.

4. A method in accordance with claim 1, wherein the deposition film for the spacers is comprised of one of a chemical vapor deposition oxide film and a nitride film and has a thickness of 300 to 1,000Å.

5. A method for forming a field oxide film in a semiconductor device, comprising the steps of:
    forming a pad oxide film, a polysilicon film, a first nitride film and an etch barrier film, in this order, over a semiconductor substrate;
    depositing a second nitride film over the etch barrier film to a thickness identical to that of the first nitride film;
    marking a field region, then sequentially etching the second nitride film and the etch barrier film to a dimension resulting from the marking of the field region, and forming a deposition film for spacers thereover;
    etching the deposition film by use of a process for forming spacers and simultaneously etching the second nitride film and the first nitride film such that the polysilicon film is partially etched, thereby forming nitride film spacers; and
    forming a field oxide film in the field region by use of a thermal oxidation process and removing the remaining first nitride film, the polysilicon film and pad oxide film.

6. A method in accordance with claim 5, wherein the pad oxide film, the polysilicon film, the first nitride film, and the etch barrier film have thicknesses of 50 to 300Å, 200 to 1,000Å, 1,000 to 2,000Å, and 200 to 500Å, respectively.

7. A method for forming a field oxide film in a semiconductor device, comprising the steps of:
    sequentially forming a pad oxide film and a first nitride film over a semiconductor substrate;
    forming a polysilicon film over the first nitride film to a thickness corresponding to a depth of a trench to be subsequently formed in the semiconductor substrate;
    forming a second nitride film over the polysilicon film to a thickness identical to that of the first nitride film;
    marking a field region, then sequentially etching the second nitride film and the polysilicon film to a dimension resulting from the marking of the field region, and forming a deposition film for spacers thereover;
    etching the resulting structure downwards from the upper surface thereof until the portion of the pad oxide film in the field region is completely removed while the remaining polysilicon film is still maintained;
    forming a trench in the semiconductor substrate until the remaining polysilicon film is completely removed; and
    forming a field oxide film in the field region by use of a thermal oxidation process and removing the remaining first nitride film and pad oxide film.

* * * * *